US012701921B2

(12) United States Patent
Arimoto et al.

(10) Patent No.: US 12,701,921 B2
(45) **Date of Patent: *Aug. 4, 2026**

(54) PIEZOELECTRIC FILM

(71) Applicant: DAIKIN INDUSTRIES, LTD., Osaka (JP)

(72) Inventors: Masaharu Arimoto, Osaka (JP); Saori Sakami, Osaka (JP); Tetsuhiro Kodani, Osaka (JP); Takashi Kanemura, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 202 days.

This patent is subject to a terminal disclaimer.

(21) Appl. No.: 18/606,707

(22) Filed: Mar. 15, 2024

(65) Prior Publication Data

US 2024/0224806 A1 Jul. 4, 2024

Related U.S. Application Data

(63) Continuation of application No. PCT/JP2022/034534, filed on Sep. 15, 2022.

(30) Foreign Application Priority Data

Sep. 16, 2021 (JP) ................................. 2021-150965

(51) Int. Cl.
*H10N 30/85* (2023.01)
*C08J 5/18* (2006.01)
(Continued)

(52) U.S. Cl.
CPC ................ *H10N 30/85* (2023.02); *C08J 5/18* (2013.01); *H10N 30/704* (2024.05); *H10N 30/87* (2023.02); *C08J 2327/16* (2013.01)

(58) Field of Classification Search
CPC .. H10N 30/045; H10N 30/098; H10N 30/704; H10N 30/85; H10N 30/857;
(Continued)

(56) References Cited

U.S. PATENT DOCUMENTS

| | | | |
|---|---|---|---|
| 2010/0068460 | A1 | 3/2010 | Moriyama et al. |
| 2013/0122275 | A1 | 5/2013 | Moriyama et al. |
| 2017/0033276 | A1 | 2/2017 | Kou et al. |

FOREIGN PATENT DOCUMENTS

| | | |
|---|---|---|
| JP | 2008-171935 | 7/2008 |
| JP | 2016-219804 | 12/2016 |

OTHER PUBLICATIONS

Extended European Search Report issued Nov. 21, 2024 in European Patent Application No. 22870024.1.

(Continued)

*Primary Examiner* — Lawrence D Ferguson
(74) *Attorney, Agent, or Firm* — Wenderoth, Lind & Ponack, L.L.P.

(57) ABSTRACT

An object is to provide an organic piezoelectric film with a high level of piezoelectricity, a high level of transparency, and a low level of retardation. The organic piezoelectric film of the present disclosure has a total light transmittance of 90% or more, an internal haze value of 0.2%/μm or less per unit film thickness or an internal haze value of 4% or less, piezoelectric constant $d_{33}$ of 13 pC/N or more, and a retardation within the range of 0.01 to 10 nm/μm per unit film thickness or a retardation within the range of 0.1 to 900 nm.

8 Claims, 1 Drawing Sheet

(51) Int. Cl.
*H10N 30/00* (2023.01)
*H10N 30/87* (2023.01)

(58) Field of Classification Search
CPC ....... H10N 30/87; H01G 7/06; C08J 2327/16; C08J 5/18
See application file for complete search history.

(56) References Cited

OTHER PUBLICATIONS

International Preliminary Report on Patentability issued Mar. 5, 2024 in International (PCT) Application No. PCT/JP2022/034534, with English-language translation.

International Search Report issued Nov. 29, 2022 in International (PCT) Application No. PCT/JP2022/034534.

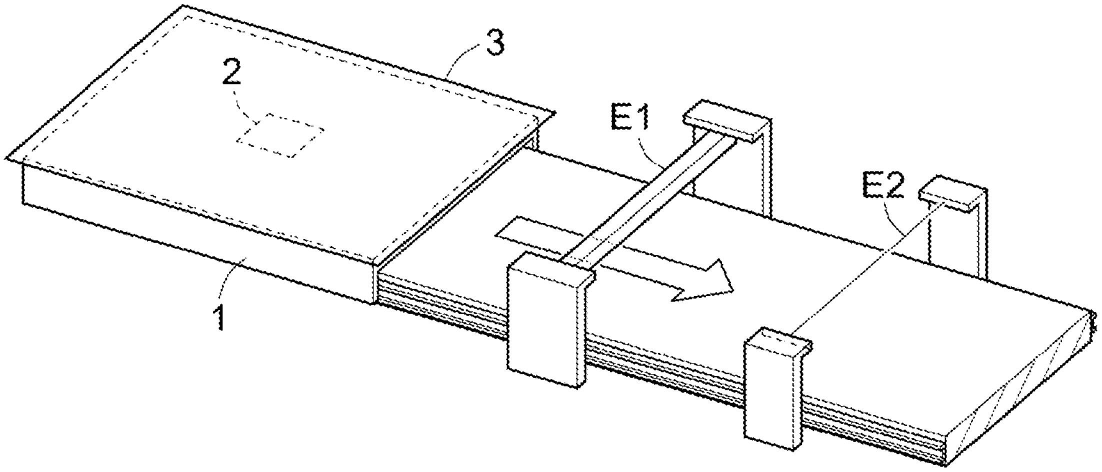
3
2
E1
E2
1

PIEZOELECTRIC FILM

TECHNICAL FIELD

The present disclosure relates to an organic piezoelectric film.

BACKGROUND ART

Organic piezoelectric films are formed from a polymer, which is an organic substance, and have piezoelectricity, i.e., the property of converting applied force into voltage, or the property of converting applied voltage into force. Organic piezoelectric films have various applications in areas in which piezoelectricity is used (e.g., sensors, actuators, touch panels, haptic devices, which have the functionality of providing feedback of tactile sensations to users, vibration-powered generators, speakers, and microphones). In particular, for organic piezoelectric films placed in a location where visibility is important (e.g., windows and displays), there is demand for a low level of retardation (phase difference) in addition to a high level of transparency in order to maintain visibility. For example, sufficient light permeability is required if an organic piezoelectric film is placed on a display. Additionally, retardation must be low to avoid interference with components of the display (e.g., a polarizer and a retarder).

Polyvinylidene fluoride (PVDF) films are typically used as organic piezoelectric films. To impart good piezoelectricity to a PVDF film, the PVDF film must be uniaxially stretched and subjected to polarization treatment (e.g., PTL 1).

CITATION LIST

Patent Literature

PTL 1: JP2008-171935A

SUMMARY

The present disclosure includes the following subject matter.

Item 1. An organic piezoelectric film, having a total light transmittance of 90% or more, an internal haze value of 0.2%/μm or less per unit film thickness, a piezoelectric constant $d_{33}$ of 13 pc/N or more, and a retardation within the range of 0.01 to 10 nm/μm per unit film thickness.

Item 2. An organic piezoelectric film having a total light transmittance of 90% or more, an internal haze value of 4% or less, a piezoelectric constant $d_{33}$ of 13 pC/N or more, and a retardation within the range of 0.1 to 900 nm.

The present disclosure provides an organic piezoelectric film with a high level of piezoelectricity, a high level of transparency, and a low level of retardation.

BRIEF DESCRIPTION OF DRAWINGS

FIG. 1 is a diagram showing an outline of a production device used in producing the piezoelectric films of the Examples.

DESCRIPTION OF EMBODIMENTS

All publications, patents, and patent applications cited in the present specification are incorporated herein by reference in their entirety.

Terms

Unless otherwise mentioned, the symbols and abbreviations in the present specification can be understood in the context of the present specification in the meaning commonly used in the technical field to which the present disclosure belongs.

In the present specification, the terms "comprise" and "contain" are used with the intention of including the terms "consisting essentially of" and "consisting of."

Unless otherwise mentioned, the steps, treatments, or operations described in the present specification may be performed at room temperature.

In the present specification, room temperature can refer to a temperature within the range of 10 to 40° C.

In the present specification, the expression "$C_{n-m}$" (n and m are each an integer, and n<m) indicates that the number of carbon atoms is n or more and m or less, as could be generally understood by a person skilled in the art.

Organic Piezoelectric Film

The organic piezoelectric film according to the present disclosure contains a piezoelectric polymer, which is an organic substance. Examples of piezoelectric polymers include, but are not limited to, vinylidene fluoride-based polymers, vinylidene cyanide-based polymers, odd-chain nylon, and polylactic acid. The piezoelectric polymer may be a single piezoelectric polymer or a combination of two or more piezoelectric polymers. The piezoelectric polymer is preferably a vinylidene fluoride-based polymer. The vinylidene fluoride-based polymer is preferably a polarized vinylidene fluoride-based polymer. In the present specification, the term "polarized" means that an electric charge is imparted to a surface. Specifically, the polarized vinylidene fluoride-based polymer may be an electret or piezoelectric substance, or a ferroelectric substance.

The vinylidene fluoride-based polymer contains at least vinylidene fluoride (VDF) as a polymerization component (monomer). The vinylidene fluoride-based polymer may be a homopolymer of vinylidene fluoride (polyvinylidene fluoride) or a copolymer of vinylidene fluoride with one or more monomers copolymerizable with vinylidene fluoride (a vinylidene fluoride-based copolymer). One or more monomers copolymerizable with vinylidene fluoride may be one or more halogen-containing monomers, one or more halogen-free monomers, or a combination of these monomers.

Examples of halogen-containing monomers include fluorine-containing monomers, such as vinyl fluoride (VF), trifluoroethylene (TrFE), tetrafluoroethylene (TFE), hexafluoropropene (HFP), 1-chloro-1-fluoroethylene (1,1-CFE), 1-chloro-2-fluoroethylene (1,2-CFE), 1-chloro-2,2-difluoroethylene (CDFE), chlorotrifluoroethylene (CTFE), trifluorovinyl monomer, 1,1,2-trifluorobutene-4-bromo-1-butene, 1,1,2-trifluorobutene-4-silane-1-butene, perfluoropropyl vinyl ether (PPVE), perfluoroacrylate, 2,2,2-trifluoroethyl acrylate, and 2-(perfluorohexyl)ethyl acrylate.

Examples of halogen-free monomers include α-olefins (e.g., ethylene and propylene), unsaturated dicarboxylic acids or derivatives thereof (e.g., maleic acid and maleic anhydride), vinyl ethers (e.g., ethyl vinyl ether), allyl ethers (e.g., allyl glycidyl ether), vinyl esters (e.g., vinyl acetate), acrylic acid or esters thereof, and methacrylic acid or esters thereof.

The vinylidene fluoride-based polymer is preferably a copolymer of vinylidene fluoride with one or more monomers copolymerizable with vinylidene fluoride (a vinylidene fluoride-based copolymer). The lower limit of the proportion of vinylidene fluoride in the copolymer (the molar ratio of the repeating unit derived from vinylidene fluoride ($—CH_2—CF_2—$) to the total repeating units) is preferably 65 mol %, 66 mol %, 67 mol %, 68 mol %, 69 mol %, 70 mol %, 71 mol %, 72 mol %, or 73 mol %. The upper limit of the proportion of vinylidene fluoride in the copolymer is preferably 85 mol %, 84 mol %, 83 mol %, or 82 mol %.

The copolymer is preferably at least one member selected from the group consisting of vinylidene fluoride-trifluoroethylene copolymers and vinylidene fluoride-tetrafluoroethylene copolymers.

The lower limit of the compositional ratio of vinylidene fluoride to trifluoroethylene (the molar ratio of the repeating unit derived from vinylidene fluoride ($—CH_2—CF_2—$) to the repeating unit derived from trifluoroethylene ($—CF_2—CHF—$)) in the vinylidene fluoride-trifluoroethylene copolymer is preferably 65/35, more preferably 70/30, and still more preferably 73/27. The upper limit of the compositional ratio is preferably 85/15, and more preferably 82/18. The compositional ratio is preferably within the range of 65/35 to 85/15, more preferably 70/30 to 85/15, and still more preferably 73/27 to 82/18.

The vinylidene fluoride-trifluoroethylene copolymer may contain only vinylidene fluoride and trifluoroethylene as polymerization components, or may contain vinylidene fluoride, trifluoroethylene, and one or more other monomers as polymerization components (e.g., a ternary copolymer and a quaternary copolymer). The one or more other monomers can be selected, for example, from the group consisting of monomers listed as examples of "one or more monomers copolymerizable with vinylidene fluoride" (excluding trifluoroethylene, however). The lower limit of the proportion of one or more other monomers is, for example, 0.01 mol %, 0.05 mol %, or 0.1 mol %. The upper limit of the proportion of one or more other monomers is, for example, 10 mol %, 5 mol %, or 1 mol %.

The lower limit of the compositional ratio of vinylidene fluoride to tetrafluoroethylene in the vinylidene fluoride-tetrafluoroethylene copolymer (the molar ratio of the repeating unit derived from vinylidene fluoride ($—CH_2—CF_2—$) to the repeating unit derived from tetrafluoroethylene ($—CF_2—CF_2—$)) is preferably 65/35, more preferably 70/30, and still more preferably 73/27. The upper limit of the compositional ratio is preferably 85/15, and more preferably 82/18. The compositional ratio is preferably within the range of 65/35 to 85/15, more preferably 70/30 to 85/15, and still more preferably 73/27 to 82/18.

The vinylidene fluoride-tetrafluoroethylene copolymer may contain only vinylidene fluoride and tetrafluoroethylene as polymerization components, or may contain vinylidene fluoride, tetrafluoroethylene, and one or more other monomers as polymerization components (e.g., a ternary copolymer and a quaternary copolymer). The one or more other monomers can be selected, for example, from the group consisting of monomers listed as examples of "one or more monomers copolymerizable with vinylidene fluoride" (excluding tetrafluoroethylene, however). The lower limit of the proportion of one or more other monomers is, for example, 0.01 mol %, 0.05 mol %, or 0.1 mol %. The upper limit of the proportion of one or more other monomers is, for example, 10 mol %, 5 mol %, or 1 mol %.

The lower limit of the content of the piezoelectric polymer in the organic piezoelectric film according to the present disclosure is, for example, 10 mass %, 20 mass %, 30 mass, 40 mass %, 50 mass, 60 mass %, or 70 mass %, and preferably 80 mass %, more preferably 85 mass %, and still more preferably 90 mass %. The upper limit of the content is not limited, and may be, for example, 100 mass % or 99 mass %.

The organic piezoelectric film according to the present disclosure may further contain a polymer other than the piezoelectric polymer. Examples of polymers other than the piezoelectric polymer include polycarbonate, polyester (e.g., polyethylene terephthalate and polyethylene naphthalate), polyamide, silicone resin, polyether, polyvinyl acetate, acrylic resin, methacrylic resin, and polyolefin (e.g., polyethylene and polypropylene). The content of the polymer other than the piezoelectric polymer is not limited, and is, for example, 100 parts by mass or less, 80 parts by mass or less, 60 parts by mass or less, 40 parts by mass or less, 20 parts by mass or less, 10 parts by mass or less, 5 parts by mass or less, or 1 part by mass or less, per 100 parts by mass of the piezoelectric polymer.

The organic piezoelectric film according to the present disclosure may consist of a piezoelectric polymer (or consist of a piezoelectric polymer and a polymer other than a piezoelectric polymer), or may contain a piezoelectric polymer and additives. Specific examples of the latter case include films containing an inorganic substance dispersed in the piezoelectric polymer.

Specific examples of additives include fillers (e.g., inorganic oxide particles), affinity improvers, heat stabilizers, UV absorbers, pigments, and combinations of one or two or more of these. Preferable examples include inorganic oxide particles, and combinations of inorganic oxide particles and affinity improvers.

Preferable examples of inorganic oxide particles include at least one member selected from the group consisting of inorganic oxide particles (B1) to (B3) described below.

Inorganic Oxide Particles (B1)

Inorganic oxide particles (B1) are particles of an oxide of a metal element of Group 2, 3, 4, 12, or 13 of the periodic table, or inorganic oxide composite particles thereof.

Examples of the metal element include Be, Mg, Ca, Sr, Ba, Y, Ti, Zr, Zn, and Al.

Preferable examples of (B1) include particles of an oxide of Be, Al, Mg, Y, or Zr. These particles are preferable because they are versatile and inexpensive, and have high volume resistivity.

More preferable examples of (B1) include particles of at least one inorganic oxide selected from the group consisting of $Al_2O_3$, MgO, $ZrO_2$, $Y_2O_3$, BeO, and $MgO·Al_2O_3$. These particles are preferable due to their high volume resistivity.

Even more preferable examples of (B1) include $Al_2O_3$ having a γ-type crystalline structure. These particles are preferable due to their large specific surface area and good dispersibility in piezoelectric polymers.

Inorganic Oxide Particles (B2)

Inorganic oxide particles (B2) are particles of an inorganic composite oxide represented by formula: $M^1_{a1}M^2_{b1}O_{c1}$, wherein $M^1$ is a metal element of Group 2, $M^2$ is a metal element of Group 4, a1 is within the range of 0.9 to 1.1, b1 is within the range of 0.9 to 1.1, c1 is within the range of 2.8 to 3.2, and $M^1$ and $M^2$ each can be one, two, or more metal elements.

Preferable examples of the metal element of Group 2 include Mg, Ca, Sr, and Ba.

Preferable examples of the metal element of Group 4 include Ti and Zr.

Preferable examples of (B2) include particles of at least one inorganic oxide selected from the group consisting of $BaTiO_3$, $SrTiO_3$, $CaTiO_3$, $MgTiO_3$, $BaZrO_3$, $SrZrO_3$, $CaZro_3$, and $MgZrO_3$. These particles are preferable due to their high volume resistivity.

Inorganic Oxide Particles (B3)

Inorganic oxide particles (B3) are an oxide of a metal element of Group 2, 3, 4, 12, or 13 of the periodic table, or inorganic oxide composite particles of silicon oxide.

Examples of the metal element include Be, Mg, Ca, Sr, Ba, Y, Ti, Zr, Zn, and Al.

Specific examples of (B3) include particles of at least one inorganic oxide selected from the group consisting of $3Al_2O_3\cdot 2SiO_2$, $2MgO\cdot SiO_2$, $ZrO_2—SiO_2$, and $MgO\cdot SiO_2$.

The inorganic oxide particles are not necessarily required to be highly dielectric, and can be appropriately selected according to the intended use of the organic piezoelectric film. For example, versatile and inexpensive inorganic oxide particles (e.g., (B1), in particular, $Al_2O_3$ particles and MgO particles) can be used to improve volume resistivity. The relative permittivity (1 kHz, 25° C.) of a single type of these inorganic oxide particles (B1) is generally less than 100, and preferably within the range of 10 or less.

For inorganic oxide particles, ferroelectric inorganic oxide particles (e.g., a relative permittivity (1 kHz, 25° C.) of 100 or more; e.g., (B2) and (B3)) may be used for the purpose of improving permittivity. Inorganic materials that form ferroelectric inorganic oxide particles include, but are not limited to, composite metal oxides, complexes of such oxides, solid solutions of such oxides, and sol-gel forms of such oxides.

The relative permittivity (25° C., 1 kHz) of inorganic oxide particles is preferably within the range of 10 or more. From the viewpoint of increasing the permittivity of the organic piezoelectric film, the relative permittivity is preferably within the range of 100 or more, and more preferably 300 or more. The upper limit of the relative permittivity is not limited, and is generally about 3000.

The relative permittivity (ε) (25° C., 1 kHz) of inorganic oxide particles is a value calculated from the capacitance (C) measured with an LCR meter, electrode area (S), and sintered body thickness (d) according to the formula $C=\varepsilon\varepsilon_0\times S/d$ ($\varepsilon_0$: permittivity in vacuum).

The inorganic oxide particles preferably have a smaller average primary particle size; in particular, nanoparticles having an average primary particle size of 1 μm or less are preferable. A small amount of such inorganic oxide nanoparticles uniformly dispersed can significantly improve the electrical insulation properties of the organic piezoelectric film. The average primary particle size is preferably within the range of 800 nm or less, more preferably 500 nm or less, and still more preferably 300 nm or less. The average primary particle size is preferably within the range of 10 nm or more, more preferably 20 nm or more, and still more preferably 50 nm or more, from the viewpoint of difficulty in production, difficulty in uniform dispersion, and costs.

The average primary particle size of inorganic oxide particles is determined using a laser diffraction-scattering particle size distribution analyzer (trade name: LA-920, Horiba, Ltd.) or an equivalent instrument.

From the viewpoint of transparency, the organic piezoelectric film preferably contains no inorganic oxide particles; however, to the extent that transparency is not impaired, the organic piezoelectric film may contain inorganic oxide particles in an amount within the range of 0.01 to 300 parts by mass, and more preferably 0.1 to 100 parts by mass, per 100 parts by mass of the piezoelectric polymer.

The lower limit of the content of inorganic oxide particles is preferably 0.1 parts by mass, more preferably 0.5 parts by mass, and still more preferably 1 part by mass, from the viewpoint of improved electrical insulation properties.

The upper limit of the content of inorganic oxide particles is preferably 200 parts by mass, more preferably 150 parts by mass, and still more preferably 100 parts by mass, from the viewpoint of uniformly dispersing inorganic oxide particles in the piezoelectric polymer and preventing a decrease in electrical insulation properties (withstand voltage) and a decrease in tensile strength of the film.

If the organic piezoelectric film contains inorganic oxide particles, the organic piezoelectric film may further contain an affinity improver.

The affinity improver can increase the affinity between the inorganic oxide particles and the piezoelectric polymer, uniformly disperse the inorganic oxide particles in the piezoelectric polymer, firmly bond the inorganic oxide particles and the piezoelectric polymer to suppress the formation of voids, and increase relative permittivity.

Specific examples of affinity improvers include coupling agents, surfactants, and epoxy group-containing compounds.

Examples of coupling agents include organic titanium compounds, organic silane compounds, organic zirconium compounds, organic aluminum compounds, and organic phosphorus compounds.

Examples of organic titanium compounds include organic titanium coupling agents (e.g., alkoxy titanium, titanium chelate, and titanium acylate). Specific examples include tetraisopropyl titanate, titanium isopropoxyoctylene glycolate, diisopropoxy-bis(acetylacetonato) titanium, diisopropoxytitanium diisostearate, tetraisopropylbis(dioctylphosphite) titanate, isopropyltri(n-aminoethyl-aminoethyl)titanate, and tetra(2,2-diallyloxymethyl-1-butyl) bis(di-tridecyl)phosphite titanate.

Preferable examples of organic titanium compounds include alkoxytitanium and titanium chelate because of their good affinity with inorganic oxide particles.

The organic silane compound may be of a high molecular-weight or a low molecular weight. Examples include alkoxysilanes (e.g., monoalkoxysilane, dialkoxysilane, trialkoxysilane, and tetraalkoxysilane), vinylsilanes, epoxysilanes, aminosilanes, methacryloxy silanes, and mercaptosilanes. If an alkoxysilane is used, hydrolysis can further improve volume resistivity (i.e., improve electrical insulation properties), which is the effect of surface treatment.

Examples of organic zirconium compounds include alkoxyzirconium and zirconium chelates.

Examples of organic aluminum compounds include alkoxyaluminum and aluminum chelates.

Examples of organic phosphorus compounds include phosphite esters, phosphate esters, and phosphate chelates.

The surfactant as an affinity improver may be of a high molecular weight or a low molecular weight, but is preferably of a high molecular weight, from the viewpoint of thermal stability.

Examples of surfactants include nonionic surfactants, anionic surfactants, and cationic surfactants.

Examples of nonionic surfactants include polyether derivatives, polyvinylpyrrolidone derivatives, and alcohol derivatives. Preferable examples includes polyether derivatives because of their good affinity with inorganic oxide particles.

Examples of anionic surfactants include polymers containing sulfonic acid, carboxylic acid, or a salt thereof. Preferable examples include acrylic acid derivative polymers and methacrylic acid derivative polymers because of their good affinity with piezoelectric polymers.

Examples of cationic surfactants include amine compounds, compounds having a nitrogen-containing heterocyclic ring (e.g., imidazoline), and halogenated salts thereof.

The epoxy group-containing compound as an affinity improver may be a low-molecular-weight compound or a high-molecular-weight compound. Specific examples include epoxy compounds and glycidyl compounds, and preferable examples include low-molecular-weight compounds having one epoxy group, from the viewpoint of affinity with piezoelectric polymers.

More preferable examples of epoxy group-containing compounds include compounds represented by the following formula:

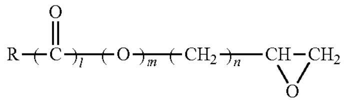

wherein R is a hydrogen atom, a methyl group, a $C_{2-10}$ hydrocarbon group optionally having an intervening oxygen atom or nitrogen atom, or an optionally substituted aromatic ring group; 1 is 0 or 1; m is 0 or 1; and n is an integer of 0 to 10.

Examples of the compound represented by the above formula include compounds having a ketone group or an ester group, and more specifically compounds represented by the following formulas:

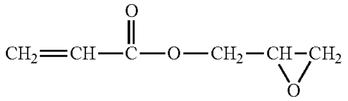

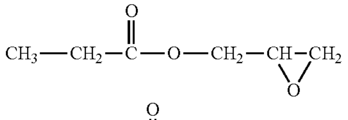

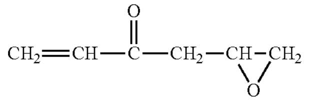

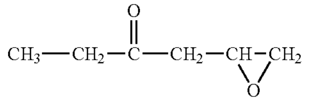

The content of the affinity improver can be preferably within the range of 0.01 to 30 parts by mass, more preferably 0.1 to 25 parts by mass, and still more preferably 1 to 20 parts by mass, per 100 parts by mass of the inorganic oxide particles, from the viewpoint of uniform dispersion and a high degree of relative permittivity of the resulting organic piezoelectric film.

The organic piezoelectric film is preferably an unstretched film. The organic piezoelectric film is preferably a cast film. Preparing the organic piezoelectric film in the form of a cast film results in a highly uniform thickness, for example, achieving a variation coefficient of film thickness of 10% or less, as described below.

Physical Properties

The organic piezoelectric film preferably has at least the total light transmittance described below, the internal haze value and/or internal haze value per unit film thickness described below, piezoelectric constant $d_{33}$ described below, and the retardation and/or retardation per unit film thickness described below. In addition to these physical properties, the organic piezoelectric film preferably has at least one type of physical properties selected from the group consisting of the variation coefficient of piezoelectric constant $d_{33}$ described below, the crystallinity described below, the film thickness described below, the variation coefficient of film thickness described below, and the area described below.

Total Light Transmittance

Method for Determining Total Light Transmittance

In the present specification, the total light transmittance can be measured according to JIS K-7361 with a haze meter (trade name: NDH-7000SP, Nippon Denshoku Industries Co., Ltd.) or an equivalent instrument.

From the viewpoint of transparency, the lower limit of total light transmittance is preferably 90%, more preferably 91%, still more preferably 92%, and particularly preferably 93%. The upper limit of total light transmittance is not limited, and can be, for example, 99.99%, 99.9%, or 99%. The total light transmittance is preferably 90% or more (e.g., within the range of 90 to 99.99%), more preferably 91% or more (e.g., within the range of 91 to 99.99%), and still more preferably 92% or more (e.g., within the range of 92 to 99.99%).

Internal Haze Value

Method for Determining Internal Haze Value

In the present specification, the internal haze value (inner haze) is determined according to JIS K 7361 with a haze meter (trade name: NDH-7000SP, Nippon Denshoku Industries Co., Ltd.) or an equivalent instrument in a haze (turbidity) test in which the film is inserted into a glass cell filled with water, and the haze value is measured.

From the viewpoint of transparency, the upper limit of the internal haze value is preferably 4%, more preferably 3.5%, still more preferably 3%, yet more preferably 2.5%, and particularly preferably 2%. The upper limit of the internal haze value can be set even lower, such as 1.5% or 1%. The lower limit of the internal haze value is not limited, and can be, for example, 0.01%, 0.05%, or 0.1%. The internal haze value is preferably 4% or less (e.g., within the range of 0.01 to 4%), more preferably 3% or less (e.g., within the range of 0.01 to 3%), and still more preferably 2% or less (e.g., within the range of 0.01 to 2%). Even if the internal haze value is within these ranges, the organic piezoelectric film can exhibit a high level of piezoelectricity.

Ratio of Internal Haze Value (%)/Film Thickness (μm)

From the viewpoint of transparency, the upper limit of the ratio of internal haze value (%)/film thickness (μm) is preferably 0.2, more preferably 0.15, and still more preferably 0.1. The lower limit of the ratio of internal haze value (%)/film thickness (μm) is not limited, and can be, for example, 0.0001, 0.0005, 0.001, or 0.005. The ratio of internal haze value (%)/film thickness (μm) is preferably 0.2 or less (e.g., within the range of 0.0001 to 0.2), more preferably 0.15 or less (e.g., within the range of 0.0001 to 0.15), and still more preferably 0.1 or less (e.g., within the range of 0.0001 to 0.1). Even if the ratio is within these ranges, the organic piezoelectric film can exhibit a high level of piezoelectricity.

Piezoelectric Constant $d_{33}$

Method for Determining Piezoelectric Constant $d_{33}$

In the present specification, piezoelectric constant $d_{33}$ is measured by applying a force of 1.0 N at 110 Hz with a piezometer system (PM300, Piezotest) or an equivalent instrument. Piezoelectric constant $d_{33}$ is measured at 10 non-arbitrarily selected points on a film, and the arithmetic mean value is taken as piezoelectric constant $d_{33}$. Ten non-arbitrary points on a film can be selected, for example, by selecting 10 points at 50-mm intervals on a straight line. The term “arbitrary” means that the variation coefficient, described later, is intended to be small.

The actual measured value of piezoelectric constant $d_{33}$ is positive or negative depending on the front or back of the film to be measured. In the present specification, the absolute value is described as the value of piezoelectric constant $d_{33}$.

The lower limit of piezoelectric constant $d_{33}$ is preferably 13 pC/N, more preferably 14 pC/N, still more preferably 15 pC/N, and even more preferably 16 pC/N. The lower limit of piezoelectric constant $d_{33}$ can be set even higher, such as 17 pC/N. The upper limit of piezoelectric constant $d_{33}$ is not limited, and can be, for example, 35 pC/N or 30 pC/N. Piezoelectric constant $d_{33}$ is preferably 13 pC/N or more (e.g., within the range of 13 to 35 pC/N), more preferably 14 pC/N or more (e.g., within the range of 14 to 35 pC/N), and still more preferably 15 pC/N or more (e.g., within the range of 15 to 35 pC/N). Even if piezoelectric constant $d_{33}$ is within these ranges, the organic piezoelectric film can exhibit a high level of piezoelectricity.

Variation Coefficient of Piezoelectric Constant $d_{33}$

The variation coefficient of piezoelectric constant $d_{33}$ is the ratio of the standard deviation of piezoelectric constant $d_{33}$ to the arithmetic mean.

From the viewpoint of in-plane uniformity, the upper limit of the variation coefficient of piezoelectric constant $d_{33}$ is preferably 2, more preferably 1.5, and still more preferably 1. From the viewpoint of production costs, the lower limit of the variation coefficient of piezoelectric constant $d_{33}$ is preferably 0.01. The variation coefficient of piezoelectric constant $d_{33}$ is preferably 2 or less (e.g., within the range of 0.01 to 2), more preferably 1.5 or less (e.g., within the range of 0.01 to 1.5), and still more preferably 1 or less (e.g., within the range of 0.01 to 1).

Retardation

Method for Determining Retardation

In the present specification, the retardation is determined by measurement with a RETS-100 testing instrument for phase difference films or optical materials (trade name, Otsuka Electronics Co., Ltd.) or an equivalent instrument by using a film sample cut to a size equal to or greater than 2 cm×2 cm. In the present specification, a value of 550 nm is used as the value of retardation.

The upper limit of the retardation is preferably 9000 nm, more preferably 8500 nm, and even more preferably 8000 nm, from the viewpoint of optical properties. The upper limit of the retardation can be set to an even lower value, such as 7000 nm, 6000 nm, 5000 nm, 4000 nm, 3000 nm, 2000 nm, 1000 nm, 500 nm, or 100 nm.

The lower limit of the retardation is not limited, and can be, for example, 0.1 nm, 0.5 nm, or 1 nm.

The retardation can be preferably within the range of 0.1 to 9000 nm, more preferably within the range of 0.5 to 8500 nm, and even more preferably within the range of 1 to 8000 nm.

Ratio of Retardation [nm]/Film Thickness [μm]

The upper limit of the ratio of retardation [nm]/film thickness [μm] is preferably 10, more preferably 9.5, and even more preferably 9, from the viewpoint of optical properties.

The lower limit of the ratio of retardation [nm]/film thickness [μm] is not limited, and can be, for example, 0.01, 0.05, or 0.1.

The ratio of retardation [nm]/film thickness [μm] is preferably within the range of 0.01 to 10, more preferably within the range of 0.05 to 9.5, and even more preferably within the range of 0.1 to 9.

Degree of Crystallinity

Method for Determining Degree of Crystallinity

In an X-ray diffraction pattern obtained by placing the film sample directly on a sample holder with an aperture and performing X-ray diffraction measurement at a diffraction angle 2θ of 10 to 40°, a baseline is set as a straight line connecting a diffraction intensity at a diffraction angle 2θ of 10° and a diffraction intensity at a diffraction angle 2θ of 25°, and the area surrounded by the baseline and a diffraction intensity curve is separated into two symmetric peaks by profile fitting. Of these peaks, the one with a larger diffraction angle 2θ is recognized as a crystalline peak, and the one with a smaller diffraction angle 2θ is recognized as an amorphous halo peak. Under these conditions, the value expressed as 100× (area of crystalline peak)/(sum of area of crystalline peak and area of amorphous halo peak) is defined as the degree of crystallinity.

The lower limit of the degree of crystallinity can be preferably 5%, more preferably 10%, and even more preferably 15%, from the viewpoint of piezoelectricity.

The upper limit of the degree of crystallinity can be, for example, 90% or 80%.

The degree of crystallinity is preferably 5% or more (e.g., within the range of 5 to 90%), more preferably 10% or more (e.g., within the range of 10 to 90%), and even more preferably 15% or more (e.g., within the range of 15 to 90%). Even within these ranges, a high level of transparency can be achieved.

Film Thickness

Method for Determining Film Thickness

In the present specification, the thickness of the film is measured with a photoelectric digital length measurement system (Digimicro MH-15M, Nikon) or an equivalent instrument at 10 points every square centimeter over the entire film in the plane direction, and the average value is determined to be the thickness of the film.

The lower limit of the film thickness is preferably 1 μm, more preferably 5 μm, even more preferably 10 μm, still more preferably 15 μm, and particularly preferably 20 μm so that the film can be used as a self-supported film.

The upper limit of the film thickness is not limited, and can be, for example, 1000 μm, 900 μm, or 800 μm.

The film thickness is preferably 1 μm or more (e.g., within the range of 1 to 1000 μm), more preferably 5 μm or more (e.g., within the range of 5 to 1000 μm), and even more preferably 10 μm or more (e.g., within the range of 10 to 1000 μm).

Variation Coefficient of Film Thickness

Method for Determining Variation Coefficient of Film Thickness

In the present specification, the variation coefficient of film thickness is defined as the variation coefficient of values measured at 10 points every square centimeter over the entire film in the plane direction.

From the viewpoint of in-plane uniformity, the upper limit of the variation coefficient of the film thickness is preferably 10%, and more preferably 5%.

The lower limit of the variation coefficient of the film thickness is not limited, and can be, for example, 0.01%, 0.05%, or 0.1%.

The variation coefficient of the film thickness is preferably 10% or less (e.g., within the range of 0.01 to 10%), and more preferably 5% (e.g., within the range of 0.01 to 5%).

Area

The lower limit of the area is preferably 9 $cm^2$, and more preferably 10 $cm^2$, from the viewpoint of industrial productivity. The lower limit of the area can be set to an even higher value, such as 50 $cm^2$, 100 $cm^2$, 200 $cm^2$, 300 $cm^2$, 400 $cm^2$, or 500 $cm^2$.

The upper limit of the area is not limited, and can be, for example, 4000 $m^2$, 3000 $m^2$, 2000 $m^2$, 1000 $m^2$, or 500 $m^2$.

The area is preferably 9 $cm^2$ or more (e.g., within the range of 9 $cm^2$ to 4000 $m^2$), and more preferably 10 $cm^2$ or more (e.g., within the range of 10 $cm^2$ to 4000 $m^2$). This range corresponds to the range of the area produced by a roll-to-roll process.

For example, the organic piezoelectric film preferably satisfies any of the following (a) to (f):

(a) a total light transmittance of 90% or more, an internal haze value of 0.2%/μm or less per unit film thickness, a piezoelectric constant $d_{33}$ of 13 pC/N or more, and a retardation within the range of 0.01 to 10 nm/μm per unit film thickness;

(b) a total light transmittance of 90% or more, an internal haze value of 4% or less, a piezoelectric constant $d_{33}$ of 13 pC/N or more, and a retardation within the range of 0.1 to 900 nm;

(c) a total light transmittance of 90% or more, an internal haze value of 4% or less, an internal haze value of 0.2%/μm or less per unit film thickness, a piezoelectric constant $d_{33}$ of 13 pc/N or more, a retardation within the range of 0.1 to 900 nm, and a retardation within the range of 0.01 to 10 nm/μm per unit film thickness;

(d) a total light transmittance of 90% or more, an internal haze value of 0.2%/μm or less per unit film thickness, a piezoelectric constant $d_{33}$ of 13 pC/N or more, a retardation within the range of 0.01 to 10 nm/μm per unit film thickness, and a film thickness within the range of 1 to 1000 μm;

(e) a total light transmittance of 90% or more, an internal haze value of 4% or less, a piezoelectric constant $d_{33}$ of 13 pC/N or more, a retardation within the range of 0.1 to 900 nm, and a film thickness within the range of 1 to 1000 μm; and (f) a total light transmittance of 90% or more, an internal haze value of 4% or less, an internal haze value of 0.2%/μm or less per unit film thickness, a piezoelectric constant $d_{33}$ of 13 pC/N or more, a retardation within the range of 0.1 to 900 nm, a retardation within the range of 0.01 to 10 nm/μm per unit film thickness, and a film thickness within the range of 1 to 1000 μm.

Use

The organic piezoelectric film of the present disclosure can be applied to various uses. Specific examples of uses include sensors (e.g., touch sensors, vibration sensors, biosensors, and tire sensors (sensors installed on the inner surface of tires)), actuators, touch panels, haptic devices (devices that have the ability to provide feedback of tactile sensations to users), vibration-powered generators (e.g., vibration-powered floors and vibration-powered tires), speakers, and microphones.

Production Method

The organic piezoelectric film of the present disclosure can be produced, for example, by a production method comprising at least one of the following steps A, B, and C, preferably a method comprising steps A to C:

step A of preparing a non-polarized film containing a piezoelectric polymer (e.g., an unstretched and non-polarized film) by a casting method;

step B of polarizing a non-polarized film (e.g., an unstretched and non-polarized film); and step C of heating a non-polarized film (e.g., an unstretched and non-polarized film), or heating the film at any time relative to step B.

Step A: Film Preparation Step

The method for producing a non-polarized film by a casting method comprises, for example, (A1) dissolving or dispersing a piezoelectric polymer (e.g., a vinylidene fluoride-based polymer) and desired components mentioned above (e.g., inorganic oxide particles and an affinity improver) in a solvent to prepare a liquid composition;

(A2) applying (casting or coating) the liquid composition to a substrate;

(A3) heating and drying the substrate to which the liquid composition has been applied at a first temperature;

(A4) heating the substrate heated at the first temperature at a second temperature that is higher than the first temperature; and (A5) cooling the substrate heated at the second temperature at a predetermined cooling rate.

These steps are preferably performed by a roll-to-roll process, from the viewpoint of industrial productivity. Steps (A3) to (A5) may also be performed by sequential transfer from a zone of exposure to a first temperature, to a zone of exposure to a second temperature that is higher than the first temperature, and a zone of exposure to a third temperature that is lower than the second temperature.

In step (A1), in the preparation of the liquid composition, the dissolution temperature is not limited and can be suitably selected according to the type of solvent for use. From the viewpoint of promoting dissolution and preventing film coloring, the dissolution temperature is preferably equal to or higher than room temperature, and equal to or lower than the solvent vaporization temperature or 80° C.

Preferable examples of the solvent, from the standpoint of coloring prevention, include ketone solvents (e.g., methyl ethyl ketone (MEK), methyl isobutyl ketone (MIBK), acetone, diethyl ketone, dipropyl ketone, and cyclohexanone), ester solvents (e.g., ethyl acetate, methyl acetate, propyl acetate, butyl acetate, and ethyl lactate), ether solvents (e.g., tetrahydrofuran, methyltetrahydrofuran, and dioxane), and amide solvents (e.g., dimethylformamide (DMF) and dimethylacetamide). These solvents may be used singly or in a combination of two or more. The amount of the amide solvent contained in the solvent is preferably 50 mass % or less.

In step (A2), the liquid composition may be cast (or applied) onto a substrate according to a commonly used method, such as knife coating, cast coating, roll coating, gravure coating, blade coating, rod coating, air doctor coating, or slot die. Of these, gravure coating or slot die is preferable from the viewpoint of easy handling, less irregular thickness of the resulting film, and excellent productivity.

The substrate for use may be, for example, a plastic film, such as polyethylene terephthalate (PET), polyethylene naphthalate (PEN), polycarbonate (PC), acrylic resin, cycloolefin-based polymer, or polyimide (PI), or a metal film, such as aluminum (Al), stainless steel (SUS), or copper (Cu). Of these, polyethylene terephthalate (PET) is preferable from the viewpoint of its versatility, cost, and productivity. Further, the substrate preferably has a smooth surface so as not only to improve the peelability of the cast-coated film, but also to obtain a smooth surface of the resulting film.

In step (A3), the substrate to which the liquid composition has been applied may be heated and dried according to typical heating and drying methods for film formation. The heating and drying may be preferably performed, for example, by passing the substrate to which the liquid composition has been applied through a high-temperature furnace (or drying furnace) by a roll-to-roll process. Alternatively, the heating and drying may be performed in batch mode to form a film.

The lower limit of the first temperature (heating and drying temperature) can be suitably selected according to the type of solvent for use (or vaporization temperature), and is, for example, 20° C., preferably 30° C., more preferably 40° C., even more preferably 50° C., still more preferably 60° C., particularly preferably 70° C., and more particularly preferably 80° C. The upper limit of the heating and drying temperature is, for example, 200° C., 190° C., 180° C., 170° C., 160° C., 150° C., 140° C., 130° C., or 120° C. The heating and drying temperature is, for example, within the range of 50 to 140° C., within the range of 60 to 130° C., or within the range of 70 to 120° C.

The lower limit of the time for heating at the first temperature (heating and drying time) is, for example, 1 second, preferably 10 seconds, and even more preferably 30 seconds. The upper limit of the heating and drying time is, for example, 60 minutes, preferably 30 minutes, and even more preferably 10 minutes. The heating and drying time is, for example, within the range of 10 seconds to 60 minutes, preferably within the range of 30 seconds to 10 minutes, and more preferably within the range of 30 seconds to 10 minutes.

In step (A4), the second temperature varies depending on the type of piezoelectric polymer. The second temperature is, for example, (the melting point−20° C.) or more, preferably (the melting point−10° C.) or more, more preferably the melting point or more, and even more preferably (the melting point+10° C.) or more. The second temperature is, for example, (the melting point+50° C.) or less, preferably (the melting point+40° C.) or less, and even more preferably (the melting point+30° C.) or less. The second temperature is, for example, within the range of the melting point−20° C. to the melting point+50° C., more preferably within the range of the melting point−10° C. to the melting point+30° C., and even more preferably within the range of the melting point+10° C. to the melting point+30° C.

Specifically, the second temperature is preferably 150° C. or more, more preferably 160° C. or more, and even more preferably 170° C. or more. Further, the second temperature is preferably 210° C. or less, more preferably 200° C. or less, and even more preferably 190° C. or less. The second temperature is, for example, within the range of 150 to 210° C., preferably within the range of 160 to 210° C., and more preferably within the range of 170 to 210° C.

The time for heating at the second temperature is, for example, 1 minute or more, preferably 5 minutes or more, and even more preferably 10 minutes or more. Further, the time for heating at the second temperature is, for example, 60 minutes or less, and preferably 30 minutes or less. The time for heating at the second temperature is, for example, within the range of 1 to 60 minutes, preferably within the range of 5 to 60 minutes, and more preferably within the range of 10 to 60 minutes.

Heating at the second temperature is preferred to eliminate the state of thermal history before dissolution or dispersion of the piezoelectric polymer that has been dissolved or dispersed in a solvent, and to reduce variation in film properties.

In step (A5), for example, cooling may be performed at a third temperature. The third temperature is not limited as long as it is lower than the second temperature, and is preferably less than the crystallization temperature. Specifically, the third temperature can be, for example, 40° C. or less or 35° C. or less. The third temperature can be, for example, 1° C. or more, 5° C. or more, or 10° C. or more. The third temperature is, for example, within the range of 1 to 40° C., and preferably within the range of 5 to 35° C. The time for cooling at the third temperature is, for example, 1 minute or more, preferably 3 minutes or more, and even more preferably 5 minutes or more. Further, the time for cooling at the third temperature is, for example, 10 minutes or less. The time for cooling at the third temperature is, for example, within the range of 1 to 10 minutes, and preferably within the range of 3 to 10 minutes.

The temperature change from the second temperature (high temperature) to the third temperature (low temperature) can shorten the time maintained at the crystallization temperature and prevent excessive crystal growth, and is preferable from the viewpoint of obtaining a film with a low internal haze value.

The lower limit of the cooling rate from the second temperature to the third temperature (e.g., the cooling rate when the temperature passes through the crystallization temperature or 130° C.) is preferably 5° C./s, more preferably 10° C./s, even more preferably 15° C./s, still more preferably 20° C./s, and particularly preferably 25° C./s, from the viewpoint of obtaining low internal haze values. The upper limit of the cooling rate is not limited, and can be, for example, 100° C./s. The cooling rate is, for example, within the range of 5 to 100° C./s, preferably within the range of 10 to 100° C./s, and more preferably within the range of 15 to 100° C./s.

Examples of cooling methods include immersion in a solvent, such as water, and contact with a cooled metal sheet or a cooled roll (e.g., a roll cooled with, for example, water or chiller water). In a roll-to-roll process, a cooling method by means of a cooling roll is preferred from the viewpoint of easy handling and excellent productivity. A method in which the film is allowed to pass through a zone filled with a refrigerant is also preferred. The refrigerant may be a liquid, such as water, or a gas, such as nitrogen gas. The cooling method is not limited to these methods as long as the cooling rate can be adjusted to be within a suitable range, and any method that satisfies practicality, productivity, etc. of the production process can be used.

The thickness of the non-polarized film prepared in step A may be set according to the film to be obtained.

Step B: Polarization Treatment Step

The polarization treatment can be performed by a commonly used method, preferably corona discharge treatment.

The conditions for the corona discharge treatment may be suitably set based on common knowledge in the related technical field. Although either negative corona or positive corona may be used for corona discharge, negative corona is preferably used because of the ease of polarization of non-polarized films.

The corona discharge treatment is not limited. The treatment can be performed, for example, by applying voltage to a non-polarized film using linear electrodes as described in JP2011-181748A; by applying voltage to a non-polarized film using needle-shaped electrodes; or by applying voltage to a non-polarized film using grid electrodes.

In order to suppress the in-plane variation of piezoelectric constant $d_{33}$ of the obtained polarized film, it is desirable that the distance between each needle-shaped electrode and/or linear electrode and the film is constant; that is, it is desirable that there is no (or extremely small) in-plane variation in the distance between each electrode and the film (specifically, the difference between the longest distance and the shortest distance is preferably within 15 mm, and more preferably within 10 mm).

In addition, for example, when voltage is continuously applied by a roll-to-roll process, it is desirable that the film is brought into close contact with the roll appropriately and uniformly by applying a constant tension to the film.

For example, when voltage is continuously applied using linear electrodes by a roll-to-roll process, the direct-current electric field is within the range of, for example, −10 to −25 kV; however, this varies depending on the distance between the linear electrodes and the non-polarized film, the film thickness, and the like. The rate of treatment is within the range of, for example, 10 to 1200 cm/min.

Alternatively, in addition to corona discharge, the polarization treatment may be performed, for example, by applying voltage to the non-polarized film with the film sandwiched between plate electrodes. More specifically, when voltage is applied to the non-polarized film with the film sandwiched between plate electrodes, the following conditions, for example, may be applied: a direct-current electric field within the range of 0 to 400 MV/m (preferably 50 to 400 MV/m) and a voltage application time within the range of 0.1 seconds to 60 minutes.

Step C: Heat Treatment Step

Preferably, step C is optionally performed at any time relative to step B. More specifically, step C may be performed before step B, simultaneously with step B, or after step B. When step C is performed after step B, the heat treatment in step C can be performed on the polarized film obtained in step B or a part in which polarization has been completed in step B. More specifically, while the polarization treatment in step B is performed, the heat treatment in step C may also be performed on the part in which the polarization treatment has been completed.

The heat treatment is not limited, and preferably includes, for example, sandwiching the film between two metal plates and heating the metal plates, heating a roll of the film in a constant-temperature chamber, heating a metal roll and bringing the film into contact with the heated metal roll in the production of the film by a roll-to-roll process, or passing the film through a heated oven by a roll-to-roll process. When step C is performed after step B, the polarized film may be heat-treated singly, or the film may be stacked on another type of film or a metal foil to form a laminated film and the laminated film may be heat-treated. In particular, when the heat treatment is performed at high temperatures, the latter method is preferable because wrinkles are less likely to be formed in the polarized film.

The temperature for the heat treatment may vary depending on the type of polarized film to be heat-treated, and is preferably within the range of the melting point of the polarized film to be heat-treated−100° C. to the melting point of the polarized film to be heat-treated+40° C.

More specifically, the temperature for the heat treatment is preferably 80° C. or more, more preferably 85° C. or more, and even more preferably 90° C. or more.

The temperature for the heat treatment is also preferably 170° C. or less, more preferably 160° C. or less, and even more preferably 140° C. or less.

The time for the heat treatment is typically 10 seconds or more, preferably 0.5 minutes or more, more preferably 1 minute or more, and even more preferably 2 minutes or more.

The upper limit of the time for the heat treatment is not limited, and the time for the heat treatment is typically 60 minutes or less.

The conditions for the heat treatment are preferably such that the temperature for the heat treatment is 90° C. or more, and the time for the heat treatment is 1 minute or more.

Roll of Organic Piezoelectric Film

The organic piezoelectric film can be preferably stored and shipped as a roll.

The roll according to one embodiment of the present disclosure may consist of the film, may have a form in which the film laminated with a protective film or the like is wound, or may comprise a core of a paper tube or the like and the film wrapped around the core.

The roll of the film preferably has a width within the range of 50 mm or more and a length within the range of 20 m or more.

The roll of the film can be prepared, for example, by winding the film using an unwinding roller and a winding roller.

From the standpoint of suppressing the deflection of the film, it is preferable to set the unwinding roller and the winding roller parallel to each other, as is usually performed.

In order to improve the slipperiness of the film, the roller preferably used is a roller with good slipperiness, specifically a roller coated with a fluororesin, a plated roller, or a roller coated with a release agent.

The uneven thickness of the film causes unevenness in the thickness of the roll, such as "high edge" (the end of the roll is thicker than the axial center of the roll; when the film thickness at both ends is lower than that in the center, the both ends are recessed compared to the center; or when the thickness changes in an inclined manner from one end to the other, the end with a lower film thickness is recessed), which may cause the formation of wrinkles. This may also cause deflection of the film (curve in a state in which no tension other than the tension due to gravity is applied) when the film is unwound.

In general, for the purpose of preventing the high edge of the roll, the edge of the film, which is the edge of the roll, is slit using a slitter. When the thickness of the film is uneven over a wide range from the edge of the film, it is difficult to prevent the high edge and recesses of the roll only by slitting the edge.

Further, in general, the high edge, recesses, and deflection are more likely to occur in films that are wider (e.g., 100 mm or more) and longer (e.g., 50 m or more).

However, since the piezoelectric film has a highly uniform thickness, even when the film is wide (e.g., 100 mm or more) and long (e.g., 50 m or more), the high edge, recesses, and deflection can be suppressed in the resulting roll without any treatment on the film or simply by slitting the edge of the film, which is the edge of the roll, using a slitter.

The edges (film edges) removed by slitting can be collected and recycled as a raw material for the film.

The roll of the film has a highly uniform thickness, and the ratio of the thickness of the roll at the thicker end to the thickness of the roll in the axial center is preferably within the range of 70% to 130% so as to suppress the deflection of the film unwound from the roll of the film.

Further, it is preferable that at least the surface material of the rollers used for producing the film and the roll thereof is polytetrafluoroethylene (PTFE), chrome plating, or stainless steel (SUS).

As a result, wrinkles on the film can be suppressed.

Piezoelectric Material

The piezoelectric material according to one embodiment of the present disclosure may be a laminate and comprises the organic piezoelectric film and an electrode provided on at least one surface of the organic piezoelectric film.

Specific examples of the electrode include indium tin oxide (ITO) electrodes, tin oxide electrodes, aluminum electrodes, metal nanowires, metal nanoparticles (e.g., silver nanoparticles), and organic conducting resins.

The piezoelectric material may be a laminate comprising the organic piezoelectric film, a positive electrode layer (or an upper electrode layer) provided on one surface of the organic piezoelectric film, and a negative electrode layer (or a lower electrode layer) provided on the other surface of the organic piezoelectric film.

The piezoelectric material may have an insulating layer on the surface of the electrode layer on which the organic piezoelectric film is not laminated. The piezoelectric material may also have a cover (e.g., an electromagnetic shielding layer) on the surface (or top surface) of the electrode layer on which the organic piezoelectric film is not laminated.

The method for producing the piezoelectric material comprises, for example:

preparing the organic piezoelectric film; and providing an electrode on at least one surface of the organic piezoelectric film.

In the step of providing an electrode, the method of forming the electrode generally includes heat treatment. Specific examples include a method of forming a film from an electrode material by a physical vapor deposition method (e.g., vacuum evaporation, ion plating, or sputtering) or by a chemical vapor deposition method (e.g., plasma CVD), and a method of applying an electrode material to a substrate.

The lower limit of the temperature for the heat treatment is, for example, 25° C., preferably 40° C., and more preferably 50° C.

The upper limit of the temperature for the heat treatment is the melting point of the polarized film to be heat-treated−3° C., such as 220° C., preferably 180° C., more preferably 150° C., and even more preferably 130° C.

The temperature for the heat treatment can be within the range of, for example, 25 to 220° C., and preferably within the range of 40 to 130° C.

The time for the heat treatment is generally within the range of 10 seconds or more, preferably 1 minute or more, more preferably 10 minutes or more, and even more preferably 15 minutes or more.

The present disclosure includes the following subject matter.

Item 1. An organic piezoelectric film, having
- a total light transmittance of 90% or more,
  - an internal haze value of 0.2%/μm or less per unit film thickness,
  - a piezoelectric constant $d_{33}$ of 13 pC/N or more, and
  - a retardation within the range of 0.01 to 10 nm/μm per unit film thickness.

Item 2. An organic piezoelectric film having
- a total light transmittance of 90% or more,
  - an internal haze value of 4% or less,
  - a piezoelectric constant $d_{33}$ of 13 pc/N or more, and
- a retardation within the range of 0.1 to 900 nm.

Item 3. The organic piezoelectric film according to Item 1 or 2, comprising a vinylidene fluoride-based copolymer film.

Item 4. The organic piezoelectric film according to Item 3, wherein the vinylidene fluoride-based copolymer is at least one member selected from the group consisting of vinylidene fluoride-tetrafluoroethylene copolymers and vinylidene fluoride-trifluoroethylene copolymers.

Item 5. The organic piezoelectric film according to Item 3 or 4, wherein the vinylidene fluoride-based copolymer is a vinylidene fluoride-trifluoroethylene copolymer.

Item 6. The organic piezoelectric film according to any one of Items 3 to 5, wherein the proportion of vinylidene fluoride in the vinylidene fluoride-based copolymer is within the range of 60 to 85 mol %.

Item 7. The organic piezoelectric film according to any one of Items 1 to 6, having a film thickness of 1 to 1000 μm.

Item 8. The organic piezoelectric film according to any one of Items 1 to 7, for use in one or more members selected from the group consisting of sensors, actuators, touch panels, haptic devices, vibration-powered generators, speakers, and microphones.

Item 9. A piezoelectric material that is a laminate, the piezoelectric material comprising:
- the organic piezoelectric film of any one of Items 1 to 7, and
- an electrode provided on at least one surface of the organic piezoelectric film.

EXAMPLES

One embodiment of the present disclosure is described in more detail below with reference to Examples; however, the present disclosure is not limited thereto.

The following electrodes were used in the Examples, which are described later.

Electrodes Used (1) A needle-shaped electrode rod with electrode needles (needle-shaped electrodes) (R=0.06 mm; produced by Morita Seishinsyo Co., Ltd.) arranged in a row at 10-mm intervals on the center line of a 20-mm-wide (10-mm-thick, 500-mm-long) brass rod.

(2) As in (1), a needle-shaped electrode rod with electrode needles (R=0.06 mm; produced by Morita Seishinsyo Co., Ltd.) arranged in a row at 15-mm intervals.

(3) A gold-plated tungsten linear electrode with a diameter of 0.1 mm (length: 500 mm)

For the organic piezoelectric film described later, the total light transmittance, internal haze value, piezoelectric constant $d_{33}$, retardation, and film thickness were measured according to the following methods.

Total Light Transmittance

The total light transmittance was measured with a haze meter (trade name: NDH-7000SP, Nippon Denshoku Industries Co., Ltd.) according to JIS K-7361.

Internal Haze Value

The film was inserted into a quartz cell filled with water, and the internal haze value was measured according to JIS K-7136 with an NDH-7000SP (trade name, Nippon Denshoku Industries Co., Ltd.).

Piezoelectric Constant $d_{33}$

Piezoelectric constant $d_{33}$ was measured with a piezometer system (PM300, Piezotest). In this measurement, a sample was clipped at 1.0 N, and the charge generated by applying a force of 0.25 N at a frequency of 110 Hz was read.

Retardation

The retardation was determined by measurement with a RETS-100 testing instrument for phase difference films or optical materials (trade name, Otsuka Electronics Co., Ltd.) using a film sample cut to a size equal to or greater than 2 cm×2 cm. A value of 550 nm was used as the value of retardation.

Film Thickness

The thickness of the film was measured with a photoelectric digital length measurement system (Digimicro MH-15M, Nikon) at 10 points every square centimeter over the entire film in the plane direction, and the thickness of the film was determined from the average value.

Examples 1 to 3

A vinylidene fluoride (VDF)-trifluoroethylene (TrFE) copolymer (VDF/TrFE=75/25 (molar ratio)) was dissolved in methyl ethyl ketone (MEK) to prepare a paint with a solids content of 20 wt %. The paint was then cast onto a PET film with a bar coater (casting), followed by heating and drying at 80° C. for 10 minutes to form a copolymer film. After treatment at 170° C. for 0.5 hours, the film was immersed in water at 23° C. and rapidly cooled to room temperature. The temperature during drying was measured with a thermocouple, and the cooling rate at a temperature of 130° C., which is near the crystallization temperature, when the temperature was cooled from 170° C. to room temperature, was calculated to be −28.7° C./s. The copolymer film peeled off from the PET film had a thickness of 40.7 μm (Example 1), 28.1 μm (Example 2), or 20.3 μm (Example 3). The copolymer film was subjected to the following polarization treatment.

Polarization Treatment

In an ISO class 7 clean room, as outlined in FIG. 1, a SUS ground electrode, which was a grounded stage 1 (length: 320 mm, width: 220 mm), was maintained at 25° C., and a non-polarized copolymer film 2 cut to a size of 50 mm×50 mm was mounted thereon. A PET film 3 (340×240 mm) was mounted on the top thereof so that its central portion covered the central portion of the non-polarized copolymer film 2. As the upper electrode, needle-shaped electrodes (first electrodes E1) arranged at 10-mm intervals, and a wire electrode formed of a single tungsten wire (r=0.05 mm) (second electrode E2), were positioned at a distance of 10 mm above the copolymer film and parallel to the top surface of the ground electrode. Then, DC voltages applied to the needle-shaped electrodes and the wire electrode were set from 0 kV to the applied voltage of 11 kV and 15 kV, respectively (Trek 610D high-voltage supplier).

The non-polarized copolymer film 2 placed on stage 1 was subjected to polarization treatment by allowing it to pass through the needle-shaped electrodes E1 and wire electrode E2 at a rate of the movement of stage 1 of 3000 mm/min. The resulting polarized copolymer film was left to stand in a drying furnace maintained at 80° C. for heat treatment to thus obtain an organic piezoelectric film.

Example 4

A vinylidene fluoride (VDF)-trifluoroethylene (TrFE) copolymer (VDF/TrFE=80/20 (molar ratio)) was dissolved in methyl ethyl ketone (MEK) to prepare a paint with a solids content of 20 wt %. Thereafter, the same procedure as in Example 1 was performed to obtain an organic piezoelectric film.

Comparative Example 1

A vinylidene fluoride (VDF)-trifluoroethylene (TrFE) copolymer (VDF/TrFE=80/20 (molar ratio)) was dissolved in methyl ethyl ketone (MEK) to prepare a paint with a solids content of 20 wt %. The paint was then cast onto a PET film with a bar coater (casting), followed by heating and drying at 80° C. for 10 minutes to form a copolymer film. After treatment at 170° C. for 0.5 hours, the film was treated at 130° C. for 0.5 hours. The copolymer film peeled off from the PET film had a thickness of 28.8 μm. The copolymer film was subjected to polarization treatment as in Example 1 to thus obtain an organic piezoelectric film.

Comparative Example 2

A vinylidene fluoride (VDF)-trifluoroethylene (TrFE) copolymer (VDF/TrFE=75/25 (molar ratio)) was dissolved in methyl ethyl ketone (MEK) to prepare a paint with a solids content of 20 wt %. The paint was then cast onto a PET film with a bar coater (casting), followed by heating and drying at 80° C. for 10 minutes to form a copolymer film. After treatment at 170° C. for 0.5 hours, the film was removed from the heating furnace and left to stand at room temperature. The temperature during drying was measured with a thermocouple, and the cooling rate at a temperature of 130° C., which is near the crystallization temperature, when the temperature was cooled from 170° C. to room temperature, was calculated to be −1.9° C./s.

The copolymer film peeled off from the PET film had a thickness of 37.1 μm. The copolymer film was subjected to polarization treatment as in Example 1 to thus obtain an organic piezoelectric film.

Comparative Example 3

A vinylidene fluoride (VDF)-trifluoroethylene (TrFE) copolymer (VDF/TrFE=75/25 (molar ratio)) was dissolved in methyl ethyl ketone (MEK) to prepare a paint with a solids content of 20 wt %. The paint was then cast onto a PET film with a bar coater (casting), followed by heating and drying at 80° C. for 10 minutes to form a copolymer film. After the film was continuously treated in a drying furnace at 80° C. for 0.5 hours, the film was removed from the drying furnace and left to stand at room temperature. The copolymer film peeled off from the PET film had a thickness of 39.8 μm. The copolymer film was subjected to polarization treatment as in Example 1 to thus obtain an organic piezoelectric film.

Comparative Example 4

Using an extruder, a vinylidene fluoride film material was supplied to a T-die while heating, and the melted vinylidene fluoride was suppled between pairs of metal rolls from the T-die and extruded into a film, while cooling, thus forming a film. As conditions under which the film was stretched, the peripheral speeds of rotation of adjacent pairs of rolls were set to differ 4-fold, whereby a tensile stress exceeding the yield point was applied to the film to form a stretched poly vinylidene fluoride (PVDF) film with a film thickness of 28 μm.

The resulting film was subjected to polarization treatment as in Example 1 to thus obtain an organic piezoelectric film.

Table 1 below shows the evaluation results of the organic piezoelectric films produced in the Examples and Comparative Examples.

TABLE 1

| | Film thickness (μm) | Internal haze (%) | Internal haze/film thickness | Piezoelectric constant $d_{33}$ | Total light transmittance (%) | Retardation (nm) | Retardation/film thickness |
|---|---|---|---|---|---|---|---|
| Ex. 1 | 40.7 | 0.6 | 0.01 | 16.1 | 93.7 | 1.53 | 0.04 |
| Ex. 2 | 28.1 | 1.0 | 0.03 | 14.3 | 93.7 | 1.09 | 0.04 |
| Ex. 3 | 20.3 | 0.9 | 0.05 | 15.1 | 93.8 | 0.17 | 0.01 |
| Ex. 4 | 23.5 | 2.0 | 0.09 | 17.4 | 93.8 | 0.58 | 0.02 |
| Comp. Ex. 1 | 28.8 | 70.5 | 2.51 | 27.3 | 91.8 | Unmeasurable | Unmeasurable |
| Comp. Ex. 2 | 37.1 | 60.4 | 1.63 | 23.8 | 91.9 | Unmeasurable | Unmeasurable |
| Comp. Ex. 3 | 39.8 | 5.0 | 0.13 | 2.2 | 93.1 | 2.8 | 0.07 |
| Comp. Ex. 4 | 39.8 | 1.2 | 0.03 | 28.5 | 93.5 | 1113 | 27.96 |

The invention claimed is:

1. An organic piezoelectric film, having a total light transmittance of 90% or more, an internal haze value of 0.2%/μm or less per unit film thickness, a piezoelectric constant $d_{33}$ of 14 pC/N or more, a retardation within the range of 0.01 to 10 nm/μm per unit film thickness, and a film thickness of 1 to 1000 μm.

2. An organic piezoelectric film having a total light transmittance of 90% or more, an internal haze value of 4% or less, a piezoelectric constant $d_{33}$ of 14 pC/N or more, a retardation within the range of 0.1 to 900 nm, and a film thickness of 1 to 1000 μm.

3. The organic piezoelectric film according to claim 1, comprising a vinylidene fluoride-based copolymer film.

4. The organic piezoelectric film according to claim 3, wherein the vinylidene fluoride-based copolymer is at least one member selected from the group consisting of vinylidene fluoride-tetrafluoroethylene copolymers and vinylidene fluoride-trifluoroethylene copolymers.

5. The organic piezoelectric film according to claim 3, wherein the vinylidene fluoride-based copolymer is a vinylidene fluoride-trifluoroethylene copolymer.

6. The organic piezoelectric film according to claim 3, wherein the proportion of vinylidene fluoride in the vinylidene fluoride-based copolymer is within the range of 60 to 85 mol %.

7. The organic piezoelectric film according to claim 1, for use in one or more members selected from the group consisting of sensors, actuators, touch panels, haptic devices, vibration-powered generators, speakers, and microphones.

8. A piezoelectric material that is a laminate, the piezoelectric material comprising:

the organic piezoelectric film of claim 1, and an electrode provided on at least one surface of the organic piezoelectric film.

* * * * *